(12) United States Patent
Tai et al.

(10) Patent No.: US 11,435,307 B2
(45) Date of Patent: *Sep. 6, 2022

(54) CARBON BASED HUMIDITY-NONSENSITIVE FILMS

(71) Applicant: KING ABDULLAH UNIVERSITY OF SCIENCE AND TECHNOLOGY, Thuwal (SA)

(72) Inventors: Yanlong Tai, Thuwal (SA); Gilles Lubineau, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 952 days.

This patent is subject to a terminal disclaimer.

(21) Appl. No.: 16/078,101

(22) PCT Filed: Mar. 2, 2017

(86) PCT No.: PCT/IB2017/051234
§ 371 (c)(1),
(2) Date: Aug. 21, 2018

(87) PCT Pub. No.: WO2017/149498
PCT Pub. Date: Sep. 8, 2017

(65) Prior Publication Data
US 2019/0072510 A1   Mar. 7, 2019

Related U.S. Application Data

(60) Provisional application No. 62/303,719, filed on Mar. 4, 2016.

(51) Int. Cl.
*G01N 27/12* (2006.01)
*H01L 51/00* (2006.01)
(Continued)

(52) U.S. Cl.
CPC .......... *G01N 27/121* (2013.01); *D21H 19/82* (2013.01); *G01N 27/127* (2013.01); *H01B 1/04* (2013.01);
(Continued)

(58) Field of Classification Search
CPC .... G01N 27/121; G01N 27/127; H05K 1/095; D21H 19/82; H01B 1/04; H01L 51/0004;
(Continued)

(56) References Cited

U.S. PATENT DOCUMENTS 9,178,129 B2 * 11/2015 Lee .......................... H01L 41/02
2011/0088931 A1    4/2011 Lettow et al.
(Continued)

FOREIGN PATENT DOCUMENTS

JP      2013191275 A    9/2013
WO     2014125292 A1   8/2014

OTHER PUBLICATIONS

Hummers et al., "Preparation of Graphitic Oxide," Journal of American Chemical Society, Mar. 1958, pp. 1339-1339, vol. 80, Issue 6. DOI: 10.1021/ja01539a017.
(Continued)

*Primary Examiner* — Marrit Eyassu
(74) *Attorney, Agent, or Firm* — Patent Portfolio Builders PLLC

(57) ABSTRACT

A humidity nonsensitive material based on reduced-graphene oxide (r-GO) and methods of making the same are provided. In an embodiment, the material has a resistance/humidity variation of about −15% to 15% based on different sintering time or temperature. In an aspect, the resistance variation to humidity can be close to zero or −0.5% to 0.5%, showing a humidity non sensitivity property. In an embodiment, a humidity nonsensitive material based on the r-GO and carbon nanotube (CNT) composites is provided, wherein the ratio of CNT to r-GO is adjusted. The ratio can be adjusted based on the combined contribution of carbon nanotube (positive resistance variation) and reduced-graphene oxide (negative resistance variation) behaviors.

20 Claims, 10 Drawing Sheets

(51) Int. Cl.
  *H05K 1/09* (2006.01)
  *D21H 19/82* (2006.01)
  *H01B 1/04* (2006.01)
  *B82Y 30/00* (2011.01)

(52) U.S. Cl.
  CPC ...... *H01L 51/0004* (2013.01); *H01L 51/0045* (2013.01); *H01L 51/0048* (2013.01); *H05K 1/095* (2013.01); *B82Y 30/00* (2013.01)

(58) Field of Classification Search
  CPC .. H01L 51/0045; H01L 51/0048; B82Y 30/00
  USPC ...................................................... 73/335.05
  See application file for complete search history.

(56) References Cited

U.S. PATENT DOCUMENTS

| | | | | |
|---|---|---|---|---|
| 2014/0079932 A1* | 3/2014 | Aksay | .................... | B82Y 30/00 428/219 |
| 2014/0287639 A1* | 9/2014 | Lee | ......................... | H01B 1/22 442/64 |
| 2016/0009934 A1* | 1/2016 | Han | ......................... | C09D 5/24 252/74 |
| 2017/0016867 A1* | 1/2017 | Chung | ............... | G01N 33/0036 |
| 2017/0152424 A1* | 6/2017 | Kim | ....................... | C04B 35/64 |
| 2017/0176370 A1* | 6/2017 | Velasquez-Garcia | ........................ | G01N 27/127 |
| 2018/0244582 A1* | 8/2018 | Li | .......................... | C04B 35/117 |
| 2018/0247722 A1* | 8/2018 | Yang | ........................ | H01B 1/04 |

OTHER PUBLICATIONS

Communication pursuant to Article 94(3) EPC in corresponding/related European Application No. 17712236.3, dated Oct. 30, 2020.
Huang, Z.-D., et al., "Self-Assembled Reduced Graphene Oxide/Carbon Nanotube Thin Films as Electrodes for Supercapacitors," Journal of Materials Chemistry, Jan. 16, 2012, Issue 8, vol. 22, pp. 3591-3599, The Royal Society of Chemistry.
International Search Report in related International Application No. PCT/IB2017/051234, dated Jun. 12, 2017.
Written Opinion of the International Searching Authority in related International Application No. PCT/IB2017/051234, dated Jun. 12, 2017.

* cited by examiner

FIG. 2A
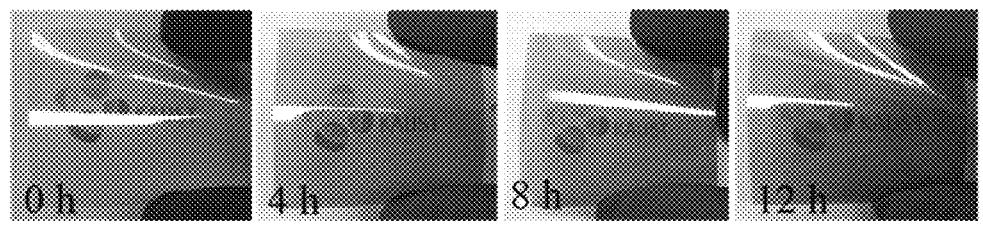
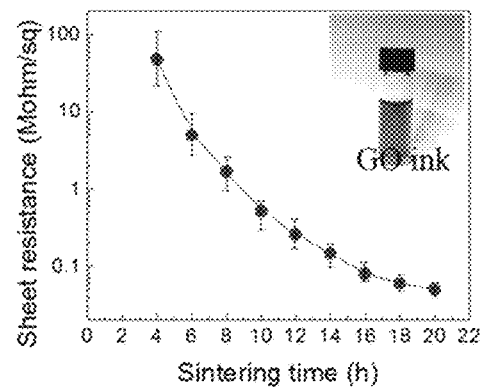
FIG. 2B
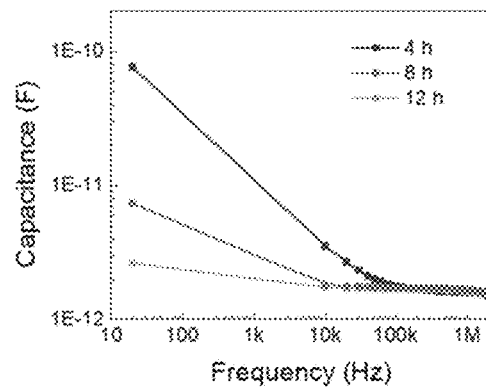
FIG. 2C

CARBON BASED HUMIDITY-NONSENSITIVE FILMS

CROSS-REFERENCE TO RELATED APPLICATION

This application is a U.S. National Stage Application of International Application No. PCT/IB2017/051234, filed on Mar. 2, 2017, which claims the benefit of and priority to U.S. Provisional Application Ser. No. 62/303,719, having the title "CARBON BASED HUMIDITY-NONSENSITIVE FILMS," filed on 4 Mar. 2016, the disclosures of which are incorporated herein by reference in their entirety.

TECHNICAL FIELD

The present disclosure generally relates to carbon-based semiconductor materials and methods of use thereof.

BACKGROUND

Water is ubiquitous in the atmosphere. Humidity plays a significant role in every part of the Earth in biology and automated industrial processes. Many electronic materials and devices are sensitive to ambient humidity levels. Many electronic devices have humidity specifications. At the top end of the range, moisture may increase the conductivity of permeable insulators leading to malfunction. Often the electronic properties of materials are sensitive to ambient humidity fluctuations, necessitating protective encapsulation technologies to provide stable operation over a range of humidity levels.

Recently, carbon-based nanomaterials, e.g., carbon nanotubes (CNTs) and reduced graphene oxide (r-GO), have been believed to be promising candidates for various flexible electronic devices like flexible transparent electrodes, electrochemical energy storage and conversion, electrical skin, and actuators. These widely practical applications are attributed to their high performance including significant flexibility with relatively high Young's modulus and good tunable metallic/semiconducting electrical properties. However, these carbon-based nanomaterials have demonstrated electronic properties that are highly sensitive to ambient humidity.

There remains a need for improved carbon-based materials, systems, and methods for overcoming the aforementioned humidity sensitivities.

SUMMARY

Here, in various aspects, a conductive film is provided with an entirely different resistance/humidity response. The resistance/humidity response can be based on the combined contribution of carbon nanotube (positive resistance variation) and reduced-graphene oxide (negative resistance variation) behaviors. The resulting mechanism is analyzed and demonstrated to be based on the effect of contact resistance ($R_{Junction}$) and intrinsic resistance ($R_{Intrinsic}$) through a series of experiments, such as resistance/humidity tests of multiwall carbon nanotube (MWCNT) with different lengths and reduced-graphene oxide (r-GO) and with different sintering times. It was found that the experimental results are very consistent with the provided theoretical mechanism. To demonstrate the practical applications of these phenomena, two kinds of humidity-non-sensitive carbon-based conductive films (full r-GO film and r-GO/MWCNTs composite films) were developed successfully. This improves the humidity failure issue of actual carbon-based electronic devices.

The present disclosure provides a first technology for humidity nonsensitive material based on r-GO, which has a resistance/humidity variation of about −15% to 15% based on different sintering time or temperature. Under the optimized sintering condition, the resistance variation to humidity can be close to zero or −0.5% to 0.5%, showing a humidity non sensitivity property. In various aspects, the optimized sintering condition of r-GO is at a temperature of about 140° C. to 160° C. for a period of time of about 7 hours to 9 hours. Other sintering time also can be accomplished via a higher sintering temperature with a shorter sintering time, or via a lower sintering temperature with a longer sintering time The present disclosure provides a second technology for humidity nonsensitive material based on the r-GO and CNT composites, wherein the ratio of CNT to r-GO is adjusted. This is because of their total different resistance/humidity sensitive behaviors, R-GO has a resistance/humidity variation of about −15% to 15% based on different sintering time or temperature, whereas CNT has a resistance/humidity variation of about 0% to 15% based on different lengths. In various aspects, the ratio (mass/mass) of CNT to r-GO can be about 0.5 to 0.7 (0.625 in the example below when CNT with the length of 30 μm and the diameter 0.5-2 nm are used). The CNTs also can be single-walled or multi-walled CNTs.

The humidity-sensitive property of semiconductor material is non-relationship with its thickness. It can have a thickness of about 10 nm to 200 nm for transparent requirement. The device can further contain one or more additional layers, e.g. transparent substrate layers such as polyethylene terephthalate, polycarbonate, polymethyl methacrylate, polyethylene naphthalate, polyethersulfone, polyvinyl alcohol, polyimide, polystyrene, or glass.

Methods of making the carbon-based semiconductor materials and electronic devices including a r-GO/CNT composite are also provided. The methods can include applying an ink to a surface of a substrate, wherein the ink contains graphene oxide and CNTs in a suitable solvent; drying the ink to produce a composite material or layer on the substrate; and sintering the material or layer at a temperature and for a period of time.

Other systems, methods, features, and advantages of the carbon-based humidity nonsensitive materials and methods of use will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Further aspects of the present disclosure will be readily appreciated upon review of the detailed description of its various embodiments, described below, when taken in conjunction with the accompanying drawings.

FIG. 1A is a picture of a measurement method to investigate the resistance/humidity response of MWCNT/r-GO based conductive films, wherein the scale bar is 1 cm. FIG. 1B is a graph of the resistance/humidity response of a MWCNT film. FIG. 1C is a graph of the resistance/humidity response of a r-GO film. The inset images in FIGS. 1B and 1C are the corresponding SEM images with a 500 nm scale bar. FIG. 1D is a microstructure model of MWCNT and r-GO based conductive films (right) and the equivalent electrical circuitry (left). The symbols in FIG. 1D include $R_{Intrinsic}$: the resistance of CNTs or r-GO plates without junctions; $R_{Carbon}$: the pure resistance of CNTs or r-GO plates at RH 0%; $R_{Ion}$: the contribution from the environment humidity; $R_{Junction}$: the contact resistance between CNTs or r-GO plates; $R_{Contact}$: the ohmic-contact resistance between CNTs or r-GO plates; $C_{EDL}$: the contribution from the environment humidity. The default MWCNT film is based on CNT-2, and the default sintering time of r-GO film at 150° C. is 5 hours.

FIGS. 2A-2C depict the basic properties of r-GO based transparent conductive films on PET substrate. FIG. 2A depicts digital images with different sintering time ranging (from left to right) 0 hours, 4 hours, 8 hours, and 12 hours. FIG. 2B is a graph demonstrating the relationship between sintering time (h, along the horizontal axis) and sheet resistance (MΩ/sq, along the vertical axis). An image of the GO ink with the concentration of 0.05 mg/ml is depicted in the inset of FIG. 2B. FIG. 2C is a graph depicting the relationship between capacitance (F, along the vertical axis) and frequency (from 20 Hz to 2 MHz, along the horizontal axis) with the sample size of 1 cm×1 cm.

FIG. 3A depicts digital images with different lengths of 10 µm to 50 µm (CNT-1), 3 µm to 30 µm (CNT-2), and 0.5 µm to 2 µm (CNT-3), with the same outer diameter of 8 µm to 15 µm, and with an overall purity of 95 wt %. FIG. 3B is a graph demonstrating the relationship between the length and sheet resistance. Images of the MWCNT inks with the concentration of 0.05 mg/ml are depicted in the inset of FIG. 3B. FIG. 3C is a graph demonstrating the relationship between capacitance (F, along the vertical axis) and frequency (from 20 Hz to 2 MHz, along the horizontal axis) with the sample size of 1 cm×1 cm.

FIG. 5A is a graph of r-GO sintered at 150° C. for 5 h. FIG. 5B is a graph of CNT-2. The objective of this test is to characterize the thickness of the r-GO and MWCNT based conductive films.

FIG. 6A depicts a series of SEM images with the corresponding network models for, from left to right, CNT-1, CNT-2, and CNT-3, all the scale bars are 500 nm. FIG. 6B is a graph of the resistance/humidity response of CNT-1, CNT-2, and CNT-3. FIG. 6C is a graph of the Nyquist plots of the impedance (real part Z' versus imaginary part Z" within the frequency range from 1 MHz to 500 MHz) of MWCNT films (incl. CNT-1, CNT-2, and CNT-3). The default humidity is room relative humidity (41.3%), and the default temperature is room temperature.

FIG. 7A is an EDAX analysis of MWCNT films with different lengths (CNT-1, CNT-2, and CNT-3, respectively). FIG. 7B is an EDAX analysis of r-GO films with different sintering times (4 h, 8 h, and 12 h, respectively, at 150° C.).

FIG. 8A is a series of SEM images showing DI-water contact angle for r-GO with different sintering times (from left to right, 4 h, 8 h, 12 h, respectively at 150° C.). FIG. 8B is a graph of the resistance/humidity response (left axis) and O/C ratio (right axis) as a function of the sintering time. FIG. 8C is a graph of the Nyquist plots of the impedance (imaginary part Z" versus real part Z' within the 1 to 500 MHz frequency range), of r-GO films with different sintering times.

FIG. 9A is a graph of the resistance/humidity response behavior of CNT-2 and r-GO based conductive films with different humidity conditions. FIG. 9B is a bar graph of the resistance/humidity response behavior of CNT-2/r-GO based conductive film with different ratios at the RH of 60%. FIG. 9C is a graph of the I-V curves of CNT-2, CNT-2/r-GO, r-GO based conductive films respectively. FIG. 9D is a graph of the resistance/humidity response behavior of r-GO based conductive films with different humidity conditions and sintering times. FIG. 9E is a graph of the I-V curves of r-GO based conductive films with the sintering times of 7 h, 8 h, and 9 h respectively. The inset of FIG. 9C is the digital image of the humidity non-sensitive test with a finger. The inset of FIG. 9E is the enlarged image of I-V curves in which it will be easy to observe the variation. The default sintering time of r-GO based conductive film is 6 h at 150° C.

DETAILED DESCRIPTION

Figure 1A:
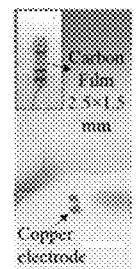
FIGS. 1A-1E depict different resistance/humidity responses of carbon-based conductive films.

Carbon-based conductive materials are provided herein exhibiting opposing resistance responses to changes in ambient humidity levels. Carbon nanotube (CNT) materials are provided demonstrating a positive resistance variation to humidity. Reduced graphene oxide (r-GO) materials are provided that demonstrate a negative resistance variation to humidity, followed by a positive resistance variation to humidity for highly sintered materials.

A variety of humidity insensitive materials are also provided, i.e. humidity nonsensitive materials. The humidity insensitive materials are provided utilizing the resistance humidity response of the carbon nanotube and reduced graphene oxide materials to provide materials that are insensitive, or at least less sensitive, to changes in the ambient humidity conditions. Methods of making the humidity insensitive materials are also provided.

Before the present disclosure is described in greater detail, it is to be understood that this disclosure is not limited to particular embodiments described, and as such may, of course, vary. It is also to be understood that the terminology used herein is for the purpose of describing particular embodiments only, and is not intended to be limiting. The skilled artisan will recognize many variants and adaptations of the embodiments described herein. These variants and adaptations are intended to be included in the teachings of this disclosure and to be encompassed by the claims herein.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present disclosure is not entitled to antedate such publication by virtue of prior disclosure. Further, the dates of publication provided could be different from the actual publication dates that may need to be independently confirmed.

Although any methods and materials similar or equivalent to those described herein can also be used in the practice or testing of the present disclosure, the preferred methods and materials are now described. Functions or constructions well-known in the art may not be described in detail for brevity and/or clarity. Embodiments of the present disclosure will employ, unless otherwise indicated, techniques of nanotechnology, organic chemistry, material science and engineering and the like, which are within the skill of the art. Such techniques are explained fully in the literature.

It should be noted that ratios, concentrations, amounts, and other numerical data can be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a numerical range of "about 0.1% to about 5%" should be interpreted to include not only the explicitly recited values of about 0.1% to about 5%, but also include individual values (e.g., 1%, 2%, 3%, and 4%) and the sub-ranges (e.g., 0.5%, 1.1%, 2.2%, 3.3%, and 4.4%) within the indicated range. Where the stated range includes one or both of the limits, ranges excluding either or both of those included limits are also included in the disclosure, e.g. the phrase "x to y" includes the range from 'x' to 'y' as well as the range greater than 'x' and less than 'y'. The range can also be expressed as an upper limit, e.g. 'about x, y, z, or less' and should be interpreted to include the specific ranges of 'about x', 'about y', and 'about z' as well as the ranges of 'less than x', less than y', and 'less than z'. Likewise, the phrase 'about x, y, z, or greater' should be interpreted to include the specific ranges of 'about x', 'about y', and 'about z' as well as the ranges of 'greater than x', greater than y', and 'greater than z'. In some embodiments, the term "about" can include traditional rounding according to significant figures of the numerical value. In addition, the phrase "about 'x' to 'y'", where 'x' and 'y' are numerical values, includes "about 'x' to about 'y'".

Definitions

Unless defined otherwise, all technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the specification and relevant art and should not be interpreted in an idealized or overly formal sense unless expressly defined herein.

The articles "a" and "an," as used herein, mean one or more when applied to any feature in embodiments of the present invention described in the specification and claims. The use of "a" and "an" does not limit the meaning to a single feature unless such a limit is specifically stated. The article "the" preceding singular or plural nouns or noun phrases denotes a particular specified feature or particular specified features and may have a singular or plural connotation depending upon the context in which it is used.

The term "resistance/humidity variation," as used herein, refers to the ratio $(R_1-R_0)/R_0$, where $R_0$ is the initial resistance at a first humidity and $R_1$ is the final resistance at a second humidity. The resistance/humidity variation is often provided as a percentage. The resistance/humidity variation is said to be a positive resistance/humidity variation when the resistance increases with increasing humidity, and the resistance/humidity variation is said to be negative when the resistance decreases with increasing humidity.

The term "oxygen-to-carbon ratio" or "O/C ratio," as used herein, means the molar ratio of oxygen atoms to carbon atoms in a molecule or material. The O/C ratio, when used to describe a material with a variety of oxidation states, may mean the statistical average O/C ratio for the material. The O/C ratio can be given as an absolute ratio or as a percentage, as will generally be apparent from the context. The O/C ratio can be measured from a variety of techniques capable of estimates the atomic content of a material. In some instances the O/C ratio is measured from spectroscopic methods such as energy-dispersive X-ray spectroscopy (EDS).

Reduced Graphene Oxide Humidity Insensitive Materials

Carbon-based semiconductor materials are provided herein including a reduced graphene oxide (r-GO), for example as a semiconductor layer in an electronic device. In various aspects, the semiconductor material contains essentially just the r-GO. The semiconductor material can contain at least 80%, 85%, 90%, 95%, 98%, 99%, or more of the r-GO by weight based upon the weight of the semiconductor material. In some embodiments the r-GO is mixed with one or more additional materials in the carbon-based semiconductor. For example, the r-GO can be mixed with other carbon-based semiconductor materials including nanoscale carbon-based materials (carbon nanotubes, fullerenes, graphite, graphene), small molecule carbon-based semiconductors (pentacene, rubrene, anthracene) and polymeric carbon-based materials (polysulfone, poly(3-hexylthiophene), poly(p-phenylene vinylene)).

The graphene oxide can be reduced to decrease the resistance/humidity variation of the semiconductor material and/or by decreasing the resistance/humidity variation of the graphene oxide. The semiconductor material and/or the r-GO can have a resistance/humidity variation that is, absolute value, about 10%, 5%, 2.5%, 1.25%, 1.0%, 0.5%, 0.25%, or less. In some embodiments the resistance/humidity response is about 0.0%, about −0.5% to 0.5%, or about −5% to 5%.

The graphene oxide can be reduced by sintering the graphene oxide in a furnace to provide reduced graphene oxide (r-GO). The r-GO can have an O/C ratio of about 15% to 30%, about 15% to 25%, or about 20% to 25%.

The degree of reduction and the degree of sintering can be adjusted by changing the sintering time and the sintering temperature. In various aspects the sintering temperature is about 120° C. to 200° C., about 130° C. to 180° C., about 140° C. to 160° C., or about 150° C. The sintering time can depend upon the temperature used. In various aspects the sintering time can be about 5 hours to 10 hours, about 7 hours to 9 hours, about 7.5 hours to 8.5 hours, or about 8 hours.

The r-GO can be made with a variety of thicknesses as needed. In some embodiments the resistance/humidity variation can depend upon the thickness of the r-GO material. The r-GO material can be thin, e.g. having a thickness of about 10 nm to 100 nm, 10 nm to 75 nm, 10 nm to 50 nm, or about 25 nm. The r-GO layer can be thick, e.g. having a thickness of about 200 nm or more, about 100 nm to 500 nm, or about 200 nm to 400 nm. In some embodiments the r-GO material can have a thickness of about 25 nm to 150 nm, about 50 nm to 100 nm, about 60 nm to 80 nm, or about 70 nm. In one or more aspects, the thickness is measured in a direction perpendicular to the substrate.

The r-GO and/or the semiconductor layer can have a sheet resistance of about 5 MΩ/sq. about 4 MΩ/sq, about 3 MΩ/sq. about 2 MΩ/sq, or less. In some embodiments the r-GO and/or the semiconductor layer has a sheet resistance of about 0.5 MΩ/sq to 5 MΩ/sq, about 0.9 MΩ/sq to 5 MΩ/sq, about 1 MΩ/sq to 3 MΩ/sq, or about 2 MΩ/sq.

The r-GO and/or the semiconductor material containing the r-GO can be used as a semiconductor layer in a variety of electronic devices, especially those where electrical stability over a variety of humidity levels is important. The electronic device can further include a variety of additional layers, e.g. emissive layers, absorption layers, hole transport layers, electron transport layers, hole blocking layers, substrate layers, protective layers, etc. In some embodiments the electronic device contains a substrate layer. One advantage of the r-GO materials can be their use as transparent semiconductor layers, so in some embodiments the one or more additional layers can include transparent layers. The substrate material can, for example, be a transparent substrate such as polyethylene terephthalate, polycarbonate, polymethyl methacrylate, polyethylene naphthalate, polyethersulfone, polyvinyl alcohol, polyimide, polystyrene, or glass.

Methods of Making Reduced Graphene Oxide Humidity Insensitive Materials

Methods of making carbon-based semiconductor materials including r-GO are provided. Methods of making electronic devices that include a semiconductor layer containing r-GO are provided. In some embodiments the semiconductor layer can contain essentially just r-GO, e.g. at least 80%, 85%, 90%, 95%, 98%, 99%, or more of the r-GO by weight based upon the weight of the semiconductor material.

The methods can include making an ink containing a graphene oxide material. The ink can include a solution or dispersion of the graphene oxide in water or a suitable organic solvent. The ink can include other stabilizers such as surfactants or acids. The graphene oxide can be present in the ink at any suitable concentration. For example, the graphene oxide can be present at a concentration of about 0.01 mg/ml to 1 mg/ml, about 0.05 mg/ml to 0.5 mg/ml, about 0.05 mg/ml to 0.25 mg/ml, or about 0.1 mg/ml.

The methods can include applying the ink to the surface of a substrate. The substrate can be a transparent substrate such as polyethylene terephthalate, polycarbonate, polymethyl methacrylate, polyethylene naphthalate, polyethersulfone, polyvinyl alcohol, polyimide, polystyrene, or glass. The substrate can be a flexible substrate.

The methods can include drying the ink to produce a graphene oxide material or layer on the substrate. The graphene oxide material can be patterned on the substrate using a variety of patterning techniques. The graphene oxide can be a layer, a strip, or a pattern on the substrate. The layer can be thin, e.g. having a thickness of about 10 nm to 100 nm, 10 nm to 75 nm, 10 nm to 50 nm, or about 25 nm. The layer can be thick, e.g. having a thickness of about 200 nm or more, about 100 nm to 500 nm, or about 200 nm to 400 nm. In some embodiments the layer can have a thickness of about 25 nm to 150 nm, about 50 nm to 100 nm, about 60 nm to 80 nm, or about 70 nm. In one or more aspects, the thickness is measured in a direction perpendicular to the substrate.

The methods can include sintering the material or layer. The sintering can be at a temperature and for a period of time sufficient to produce a r-GO, wherein the material or layer has a resistance/humidity variation of about 0.0%, about −0.5% to 0.5%, or about −5% to 5%. The degree of reduction and the degree of sintering can be adjusted by changing the sintering time and the sintering temperature. In various aspects the sintering temperature is about 120° C. to 200° C., about 130° C. to 180° C., about 140° C. to 160° C., or about 150° C. The sintering time can depend upon the temperature used. In various aspects the sintering time can be about 5 hours to 10 hours, about 7 hours to 9 hours, about 7.5 hours to 8.5 hours, or about 8 hours.

Composite Carbon Nanotube/Reduce Graphene Oxide Humidity Insensitive Materials

Carbon-based semiconductor materials are provided including a composite containing a reduced graphene oxide (r-GO) and carbon nanotubes (CNT), for example as a semiconductor layer in an electronic device. In various aspects, the semiconductor material contains essentially just the r-GO and CNT. The semiconductor material can contain at least 80%, 85%, 90%, 95%, 98%, 99%, or more of the r-GO/CNT composite by weight based upon the weight of the semiconductor material. In some embodiments the r-GO/CNT composite is mixed with one or more additional materials in the carbon-based semiconductor.

The ratio of the CNT to the r-GO can be adjusted such that the material has a decreased resistance/humidity response. In some embodiments the ratio of CNT to r-GO (mass/mass) is about 0.2 to 1.0, about 0.3 to 0.9, about 0.4 to 0.8, about 0.5 to 0.7, about 0.6 to 0.65, or about 0.625.

The ratio of the CNT to the r-GO can be adjusted to decrease the resistance/humidity variation of the semiconductor material. The semiconductor material can have a resistance/humidity variation that is, absolute value, about 10%, 5%, 2.5%, 1.25%, 1.0%, 0.5%, 0.25%, or less. In some embodiments the resistance/humidity response is about 0.0%, about −0.5% to 0.5%, or about −5% to 5%.

The composite can include CNTs. The CNTs can include a variety of lengths and/or diameters. The CNT can be single-walled or multi-walled CNTs. The CNT can have an average outer diameter of about 2 nm to 50 nm, about 5 nm to 50 nm, about 5 nm to 40 nm, about 10 nm to 40 nm, or about 10 nm to 30 nm. The CNTs can have an average length of about 0.1 μm to 100 μm, about 0.5 μm to 100 μm, about 0.5 μm to 50 μm, about 1 μm to 50 μm, about 1 μm to 25 μm, or about 1 μm to 10 μm.

The r-GO/CNT composite can be made with a variety of thicknesses as needed. In some embodiments the resistance/humidity variation can depend upon the thickness of the composite material. The composite material can be thin, e.g. having a thickness of about 10 nm to 100 nm, 10 nm to 75 nm, 10 nm to 50 nm, or about 25 nm. The composite material can be thick, e.g. having a thickness of about 200 nm or more, about 100 nm to 500 nm, or about 200 nm to 400 nm. In some embodiments the composite material can have a thickness of about 25 nm to 150 nm, about 50 nm to 100 nm, about 60 nm to 80 nm, or about 70 nm.

The sheet resistance of the composite material can be balanced by the ratio of the r-GO and the CNT. The composite material and/or the semiconductor layer can have a sheet resistance of about 5 MΩ/sq, about 4 MΩ/sq, about 3 MΩ/sq, about 2 MΩ/sq, or less. The composite materials can be optimized to have a very low sheet resistance, in some embodiments about 50 kΩ/sq to 800 kΩ/sq, about 50 kΩ/sq to 500 kΩ/sq, about 100 kΩ/sq to 500 kΩ/sq, about 100 kΩ/sq to 300 kΩ/sq, or about 200 kΩ/sq.

The r-GO/CNT composite material can be used as a semiconductor layer in a variety of electronic devices, especially those where electrical stability over a variety of humidity levels is important. The electronic device can further include a variety of additional layers, e.g. emissive layers, absorption layers, hole transport layers, electron transport layers, hole blocking layers, substrate layers, protective layers, etc. In some embodiments the electronic device contains a substrate layer. One advantage of the composite materials can be their use as transparent semiconductor layers, so in some embodiments the one or more additional layers can include transparent layers. The substrate material can, for example, be a transparent substrate such as polyethylene terephthalate, polycarbonate, polymethyl methacrylate, polyethylene naphthalate, polyethersulfone, polyvinyl alcohol, polyimide, polystyrene, or glass.

Methods of Making Composite Carbon Nanotube/Reduce Graphene Oxide Humidity Insensitive Materials Methods of making carbon-based semiconductor materials including a composite of r-GO and CNTs are provided. Methods of making electronic devices that include a semiconductor layer containing the r-GO/CNT composites are provided. In some embodiments the semiconductor layer contain essentially just the r-GO/CNT composite, e.g. at least 80%, 85%, 90%, 95%, 98%, 99%, or more of the composite material by weight based upon the weight of the semiconductor material.

The methods can include making an ink containing a graphene oxide material. The ink can include a solution or dispersion of the graphene oxide in water or a suitable organic solvent. The ink can include stabilizers such as surfactants or acids. The graphene oxide can be present in the ink at any suitable concentration. For example, the graphene oxide can be present at a concentration of about 0.01 mg/ml to 1 mg/ml, about 0.01 mg/ml to 0.25 mg/ml, about 0.05 mg/ml to 0.5 mg/ml, about 0.05 mg/ml to 0.25 mg/ml, or about 0.1 mg/ml.

The methods can include making an ink containing the CNTs. The ink can include a solution or dispersion of the CNTs in water or a suitable organic solvent. The ink can include an aqueous dispersion of poly(3,4-ethylenedioxythiophene) polystyrene sulfonate (PEDOT/PSS) or other conductive polymer, or a combination thereof. The CNT can be present in the ink at any suitable concentration. In some embodiments the CNT is present at a concentration of about 0.01 mg/ml to 1 mg/ml, 0.01 mg/ml to 0.025 mg/ml, about 0.05 mg/ml to 0.5 mg/ml, about 0.05 mg/ml to 0.25 mg/ml, or about 0.1 mg/ml.

The methods can include making an ink containing a mixture of the graphene oxide material and the CNT. The methods can include combining a first ink containing the graphene oxide material with a second ink containing the CNT. The mass ratio of the CNT to the GO in the ink can be about 0.2 to 1.0, about 0.4 to 0.8, about 0.3 to 0.9, about 0.4 to 0.8, about 0.5 to 0.7, about 0.6 to 0.65, or about 0.625.

The method can include applying the ink containing the r-GO and CNT to the surface of a substrate. The substrate can be a transparent substrate such as polyethylene terephthalate, polycarbonate, polymethyl methacrylate, polyethylene naphthalate, polyethersulfone, polyvinyl alcohol, polyimide, polystyrene, or glass. The substrate can be a flexible substrate.

The methods can include drying the ink to produce a composite material or layer on the substrate. The composite material can be patterned on the substrate using a variety of patterning techniques. The composite material can be a layer or strip on the substrate. The layer can be thin, e.g. having a thickness of about 10 nm to 100 nm, 10 nm to 75 nm, 10 nm to 50 nm, or about 25 nm. The layer can be thick, e.g. having a thickness of about 200 nm or more, about 100 nm to 500 nm, or about 200 nm to 400 nm. In some embodiments the layer can have a thickness of about 25 nm to 150 nm, about 50 nm to 100 nm, about 60 nm to 80 nm, or about 70 nm.

The methods can include sintering the material or layer. The sintering can be at a temperature and for a period of time sufficient to produce a r-GO, wherein the material or layer has a resistance/humidity variation of about 0.0%, about −0.5% to 0.5%, or about −5% to 5%. The degree of reduction and the degree of sintering can be adjusted by changing the sintering time and the sintering temperature. In various aspects the sintering temperature is about 120° C. to 200° C., about 130° C. to 180° C., about 140° C. to 160° C., or about 150° C. The sintering time can depend upon the temperature used. In various aspects the sintering time can be about 1 hours to 9 hours, about 2 hours to 8 hours, about 3 hours to 7 hours, about 4 to 6 hours, or about 5 hours.

EXAMPLES

Now having described the embodiments of the present disclosure, in general, the following Examples describe some additional embodiments of the present disclosure. While embodiments of the present disclosure are described in connection with the following examples and the corresponding text and figures, there is no intent to limit embodiments of the present disclosure to this description. On the contrary, the intent is to cover all alternatives, modifications, and equivalents included within the spirit and scope of embodiments of the present disclosure.

Materials

Carboxyl group (—COOH) functionalized multi-wall carbon nanotube (MWCNT) with different lengths were purchased from Cheap Tubes, Inc., incl. CNT-1: length=10-50 μm, CNT-2: length=3-30 μm, CNT-3: length=0.5-2 μm, with the same outer diameter=8-15 nm and over 95 wt. % purity. Graphite oxide ink (0.1 mg/ml) was self-synthesized and prepared in the lab from purified natural graphite (SP-1, Bay Carbon) by the Hummers method (Hummers, W. S. & Offeman, R. E., *J. Am. Chem. Soc.* 80, 1339 (1958)), as shown in FIGS. 2A-2C. Poly(3,4-ethylenedioxythiophene) polystyrene sulfonate (PEDOT/PSS) aqueous dispersion (1.3 wt. %, Clevios™ PH1000) was purchased from HC Starck, Inc. Polyethylene terephthalate (PET) films were purchased from Teonex® Inc. with the thickness of 125 μm. Deionized water was used in all experimental processes.

Fabrication of MWCNT/r-GO Based Conductive Patterns

Figure 3A:
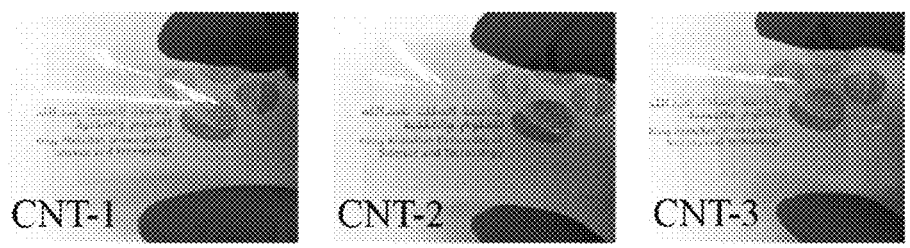
FIGS. 3A-3C depict the basic properties of MWCNT based transparent conductive films on PET substrate.
Figure 3B:
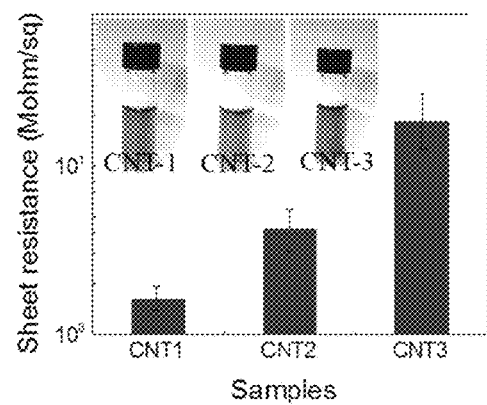

MWCNT Inks:

MWCNT (0.2 g, CNT-1), PH1000 with 5 wt. % (PEDOT-PSS to SWCNT), and DI water were combined in a glass bottle. The solid content (10 mg/ml) of SWCNT was confirmed for the prepared suspensions. Next, the mixture was homogenized using a Brason 8510 bath sonicator (Thomas Scientific) for 1 h, followed by the exfoliation of the SWCNTs through an ultrasonic processor (Cole-Parmer) at 20 kHz and 500 W for 40 min in an ice bath to prevent extensive heating and damage to the SWCNTs and PEDOT-PSS. Inks with the desired concentrations (0.1 mg/ml) were obtained by diluting the above mother inks with DI water. A similar process was used to prepare CNT-2 and CNT-3 inks. Typical inks are shown in FIG. 3B.

MWCNT/GO Inks:

The prepared MWCNT ink (0.1 mg/ml, CNT-2) was added into GO ink (0.1 mg/ml, 5 ml) with different volumes (0, 1, 2, 3, 4 and 5 ml). This preparation was homogenized using a Brason 8510 bath sonicator (Thomas Scientific) for 0.5 h. Inks with different mass ratios (MWCNT to GO, 0, 0.2, 0.4, 0.6, 0.8, 1.0) were prepared.

Carbon-Based Conductive Pattern:

Carbon-based conductive films were prepared through the drop casting approach on a PET substrate. Specifically, PET films were treated with oxygen plasma at 100 W for 60 s to generate substrate with better hydrophilicity. Next, we created a frame by sticking Teflon film tape in which rectangle holes of specific sizes were made, on the substrate. The as-prepared inks (incl. MWCNT ink, GO ink, or MWCNT/GO mixing inks) were dropped into the holes using a Thermo Scientific Finnpipette (0.2-2 µl) with a controlled concentration of 1 µl/cm$^2$. Before the Teflon frame was peeled off, these inks were baked on a hotplate at 100° C. for 30 minutes. The whole process was performed gently to achieve a homogeneous film.

R-GO based conductive patterns with different conductivities were obtained by adjusting the sintering time from 0 to 24 hours at 150° C. on a hotplate. The default sintering time is 5 hours. CNT-2/r-GO patterns with different mass ratios can be obtained by controlling the sintering time for 5 hours at 150° C. on a hotplate for the humidity sensitive test. Typical MWCNT, r-GO, and MWCNT/r-GO based conductive films are shown in FIGS. 2A and 3A.

Characterization and Measurements

The prepared carbon-based patterns were examined by scanning electron microscopy (SEM, Quanta 600, FEI Company) for surface morphology analysis. This was done using a surface profilometer (Veeco Dektak 150) operating at a scanning speed of 0.167 µm/s. Energy-dispersive X-ray spectroscopy (EDS) was performed for surface element analysis using an EDAX EDS detector operating at 20 kV. Static contact angle measurements (VCA Video Contact Angle System, AST Products, Billerica, Mass.) of DI water were performed using the sessile drop method for surface wettability evaluation. An LCR meter (E4982A, Agilent Technologies) was used with frequencies ranging from 1 MHz to 3 GHz for Nyquist plots of the impedance (real part Z' versus imaginary part Z'' within the frequency range of 1 to 500 MHz). A semiconductor characterization system (4200-SCS, Keithley company) was also used as well as a Cascade Microtech (Summit-11600 AP) microprobe station for resistance/humidity stability evaluation via I-V curves. A multimeter (Agilent 34401A) allowing data recording on a PC was used for mapping the real-time resistance/humidity response.

Figure 4:
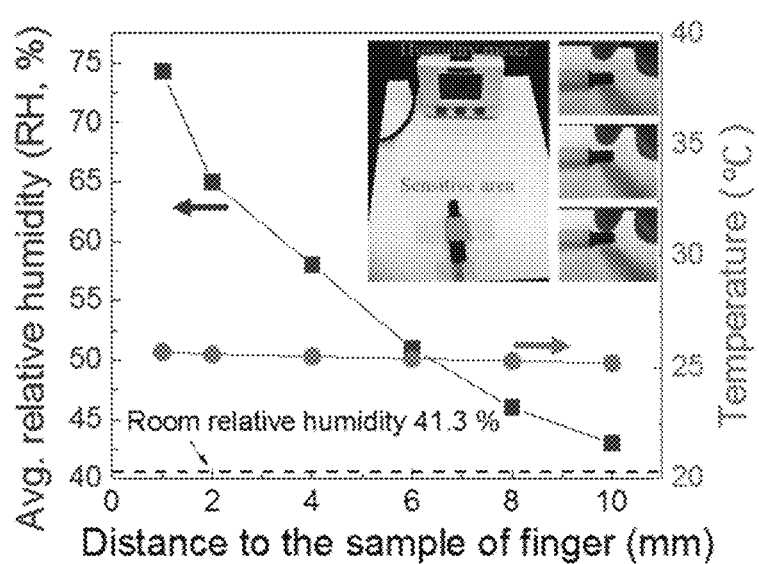
FIG. 4 is a graph of the relationship between relative humidity and distance of the sample to a human index finger calibrated by an RH reference sensor (TM325, Dickson).

It should be noted that a human index finger was used as the humidity source. To ensure precise environmental conditions, humidity and temperature around the finger were thoroughly calibrated using a humidity meter (TM325, Dickson), as shown in FIG. 4. Different humidity environments were defined according to the distance (using a ruler) between the index finger and the sample. This method is very effective to verify the efficiency of these devices intuitively in practical applications to human/machine interaction. The default room relative humidity (RH) and temperature were 41.3% and 25.2° C., respectively. Note that the finger-displacement speed was obtained from plots of resistance variation vs. time.

Results and Analysis

Difference in Resistance Responses

Figure 5A:
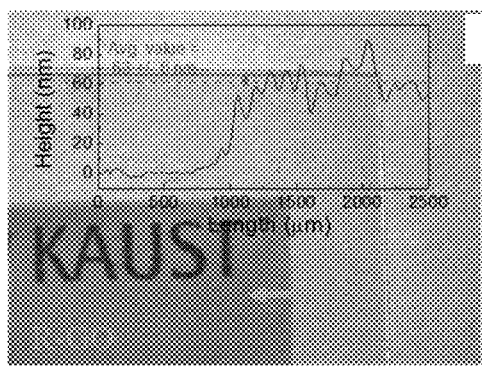
FIGS. 5A-5B depict surface profiles of the prepared carbon based transparent conductive film on PET substrate.
Figure 5B:
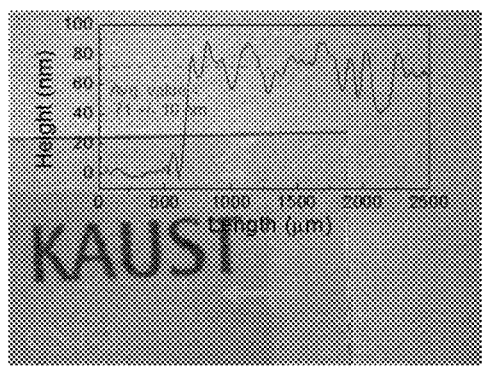

To precisely present the difference of resistance response to humidity of MWCNT and r-GO, conductive patterns (1.5×2.5 mm) made with films of same thicknesses were fabricated on PET substrates with corresponding inks and similar concentrations. This resulted in pattern thicknesses of 71±10 nm for MWCNT, 63±6 nm for r-GO, as shown in FIGS. 5A-5B. The influence of this thickness is not insignificant. Controlled humidity was provided in the vicinity of the conductive film by approaching the human index finger at various measured distances, as shown in FIG. 1A.

Figure 1B:
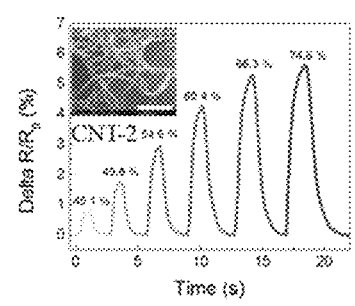
Figure 1C:
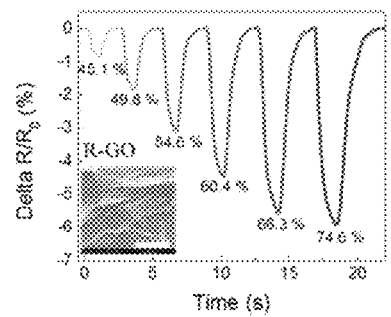

The resistance/humidity response of CNT-2 films can be seen in FIG. 1B. Results show that, with a decreasing distance between the finger and the conductive film, the total resistance variation (Delta $R/R_0=(R_1-R_0)/R_0$, where $R_0$ and $R_1$ are the original and updated resistance, respectively) increased gradually. This variation can be as high as 5.9% positively when the distance is 1 mm while exhibiting a humidity sensitivity of 0.197 $RH^{-1}$ (Sensitivity=$\delta(\Delta R/R_0)/\delta RH$). A similar phenomenon also took place on r-GO films in FIG. 1C whereas when the distance is 1 mm, the resistance variation is as low as 6.2% negatively while exhibiting a humidity sensitivity of 0.21 $RH^{-1}$.

Figure 1D:
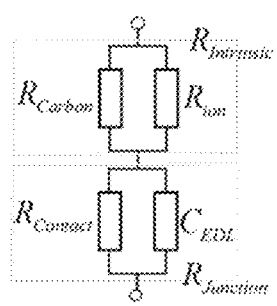

SEM observations of the film microstructure (shown in the inset images of FIGS. 1B and 1C) reveal that the total resistance is composed of the intrinsic resistance of CNT or r-GO ($R_{Intrinsic}$) and the contact resistance resulting at the junctions ($R_{Junction}$) among CNTs in one case and r-GO plates in the other case. This can be represented with the electrical circuit schematic shown in FIG. 1D and expressed with the following equation, Eq. 1.

$$\Sigma \Delta R = \Delta R_{Intrinsic} + \Delta R_{Junction} \qquad (1)$$

It has been reported that when the environment humidity increases, the hydrophilic functional groups (e.g., epoxy, hydroxyl and carboxyl) on the surface of CNTs and r-GOs generated during the production process can absorb water molecules with high efficiency through physical diffusion or hydrogen bonding. Then, these absorbed water molecules produce hydronium ions ($H_3O^+$) that become charged carriers through the ionized process when an electrostatic field is applied to the carbon nanomaterials, which conductivity eventually increases. Hence, both CNT and r-GO should present an n-type semiconductor behavior. However, this prediction is not consistent with the experiment results shown in FIGS. 1B and 1C.

This contradiction is explained by the fact that the junctions also absorb water molecules, resulting in a change of contact from the ohmic type to ohmic/capacitance type (electrical double layer, $C_{EDL}$). This contact modification leads to the increase of contact resistance. Hence, it can be deduced that, regarding CNT film, the resistance/humidity response of junctions among CNTs plays a more important role than that of the intrinsic resistance of CNT ($|\Delta R_{Intrinsic}| < |\Delta R_{Junction}|$). This explains the positive resistance/humidity response of the CNT film.

Figure 1E:
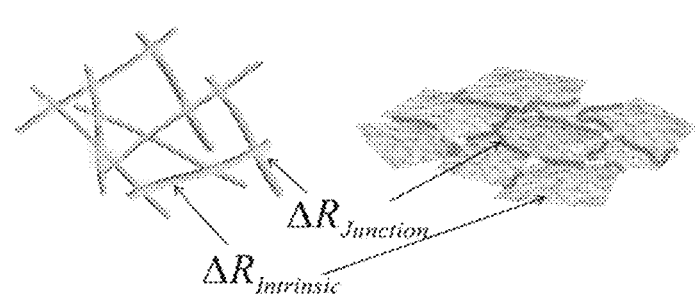

As regards the r-GO film, the resistance response to humidity is more influenced by that of the intrinsic resistance of r-GO than that generated at the junctions among r-GO plates ($|\Delta R_{Intrinsic}| > |\Delta R_{Junction}|$). This explains the negative resistance/humidity response of the r-GO film. See, e.g., FIG. 1E.

Mechanistic Analysis

To validate our model (eq. 1) and estimate the contribution of each resistive component of the related equation, a sensitivity study of different parameters was performed. The general strategy was to consider only one parameter while the other was kept constant.

Contribution of $R_{Junction}$ in the Resistance/Humidity Response

Figure 3C:
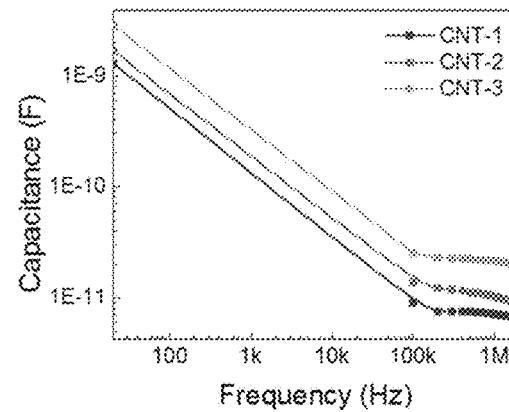
Figure 6A:
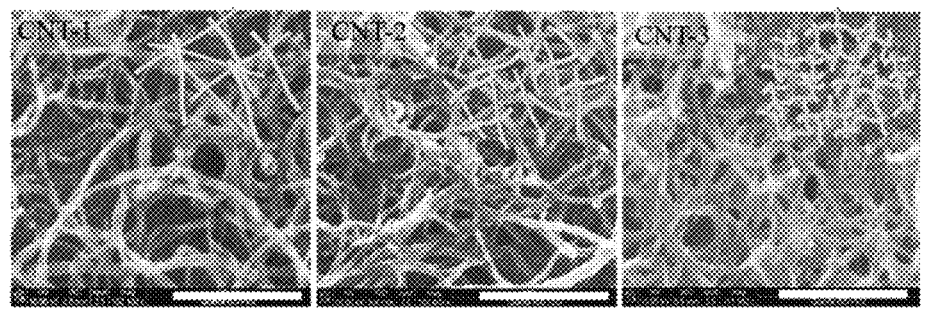
FIGS. 6A-6C demonstrate the influence of $R_{Junction}$ on the resistance/humidity response.
Figure 7A:
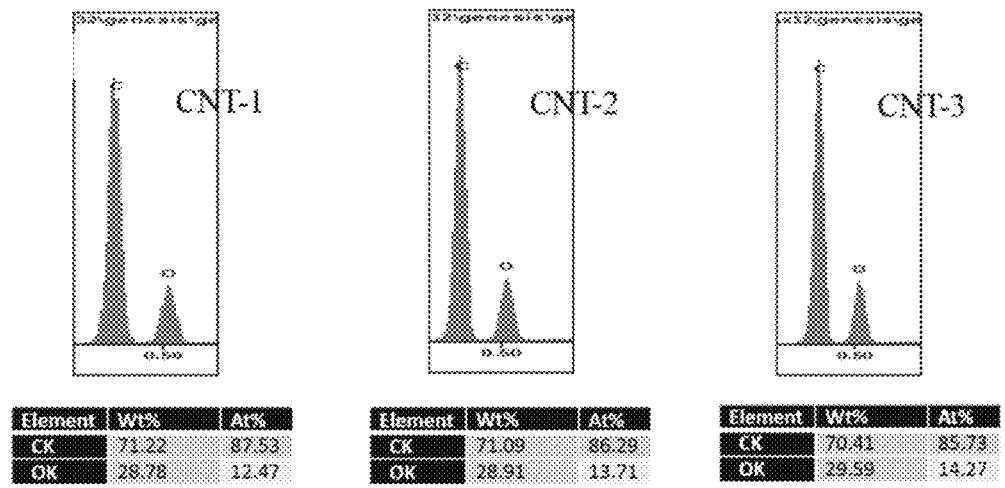
FIGS. 7A-7B depict the EDAX analysis (element ratio of carbon and oxygen) of the samples.

First, MWCNT with different lengths, L1, L2 and L3, and L1<L2<L3, were used to fabricate CNT-1, CNT-2, and CNT-3 conductive films, respectively, as shown in FIGS. 3A-3C. As these MWCNTs have the same surface properties (—COOH) and the same carbon/oxygen ratio (70.41-71.22 wt. % in FIG. 7A), the intrinsic resistance ($R_{Intrinsic}$) of these conductive films are assumed to be identical. However, when sheet resistances are measured, a difference from 1.8 Mohm in CNT-1 to 18 Mohm in CNT-3) is observed (FIGS. 3A-3C). This is attributed to the greater quantity of junctions generated by shorter CNTs and considering similar film thicknesses. This can be confirmed from the observation of the microstructure in the SEM images, FIG. 6A, and the related relevant schematic network.

Figure 6B:
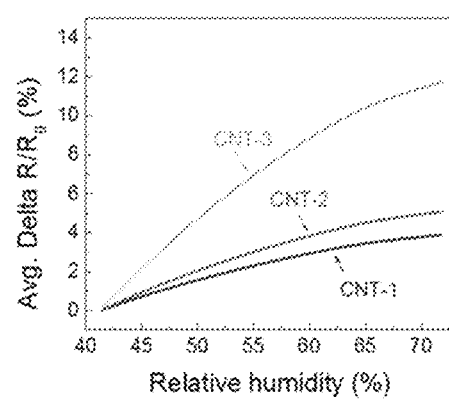

Second, the resistance of these conductive films was measured for different levels of humidity, as shown in FIG. 6B. Results demonstrated that the resistance variation augmented proportionally with increasing environment humidity. In specific, when the humidity changes from 43% (Room RH=41.3%) to 74.2%, the total resistance variation is 3.6% (CNT-1), 5.1% (CNT-2), and 11.4% (CNT-3), respectively. The influence of junctions is assumed to be very strong. This is because the contact type of these junctions changes from ohmic to ohmic/capacitance contact, leading to the increase of contact resistance that is due to the generated $C_{EDL}$. In addition, it can be seen that the sensitivity to humidity decreased gradually. This is because the absorption of water molecules is made via hydrogen bonding at the beginning, then via a physical diffusion mechanism during which the ionization effect is less significant.

Figure 6C:
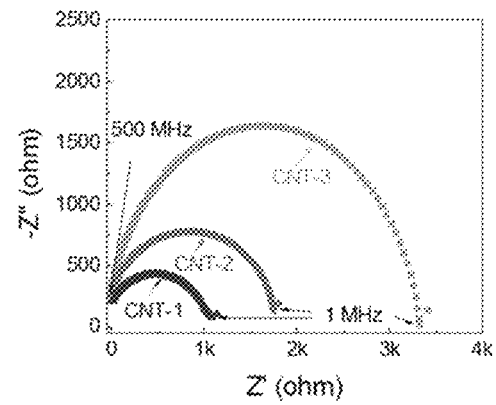

Third, the behavior of the junctions among MWCNTs was investigated through Nyquist plots. Results, summarized in FIG. 6C, show that the values of both the imaginary part Z" and the real part Z' increase from CNT-1 to CNT-3 at each frequency within the 1 to 500 MHz frequency range. The gradual increase of the imaginary part Z" indicates the existence of $C_{EDL}$ and the proportional relationship to the junction amounts. In addition, similar results are obtained when relating capacitance to frequency (FIG. 3C).

Contribution of Intrinsic Resistance in the Resistance/Humidity Response

Figure 8A:
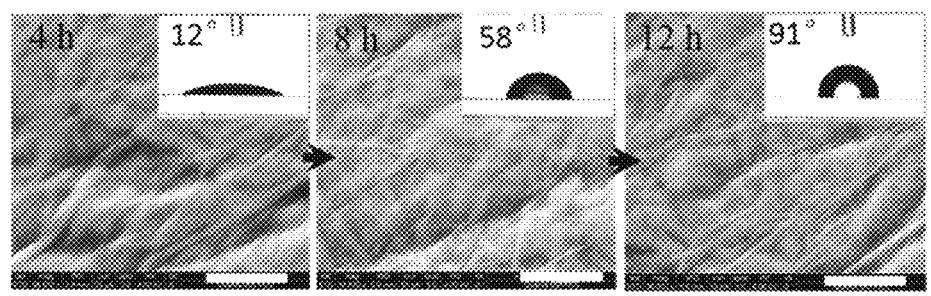
FIGS. 8A-8C demonstrate the influence of $R_{Intrinsic}$ of r-GO on the resistance/humidity response.

First, r-GO based conductive films manufactured with different thermal reducing times were investigated. According to previous reports, the number of hydrophilic functional groups (e.g., epoxy, hydroxyl, and carboxyl) existing on the surface of r-GO plates, will gradually reduce during the sintering process, reducing at the same time the number of defects and finally increasing conductivity of the films (FIG. 4). For our samples, almost no difference was observed by SEM (FIG. 3A), but these changes were confirmed by DI-water contact angle measurements, as shown in the inset of FIG. 8A. The contact angle was 12° for a sintering time of 4 h, 57° for a sintering time of 8 h, and 98° for a sintering time of 12 h. Moreover, sheet resistance also improved from 52 Mohm (4 h) to 2.1 Mohm (8 h) and to 0.285 Mohm (12 h) (FIG. 2B). Hence, these r-GO films composed of stacked r-GO layers have the same junction amounts but different intrinsic resistances. Relevant digital images can be seen in FIG. 2A.

Figure 7B:
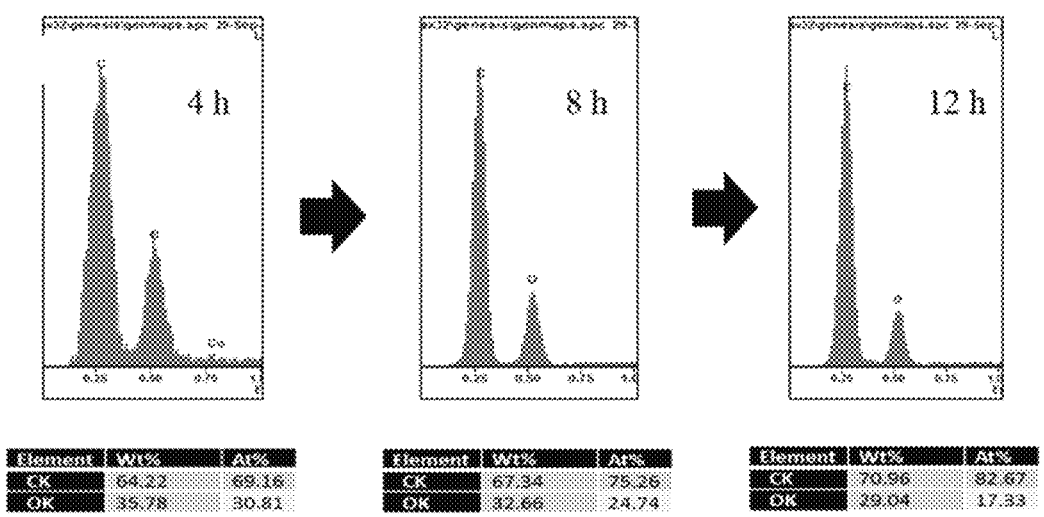

Second, resistance for different sintering durations was investigated according to humidity. Experimental results, summarized in FIG. 8B, exhibited that with the increased sintering time, the negative resistance variation reduced gradually. This is attributed to the reduction of the hydrophilic functional groups, confirmed by the O/C ratio variation in FIG. 8B and FIG. 7B. Hence, the resistance contribution of $R_{Intrinsic}$ reduced regularly compared to that of $R_{Junction}$. A very interesting phenomenon was observed as the negative resistance variation reversed to positive after a sintering time of 8 hours at 150° C. This indicated that in this resistance system, $R_{Intrinsic}$, has a smaller resistance contribution than $R_{Junction}$.

Figure 8B:
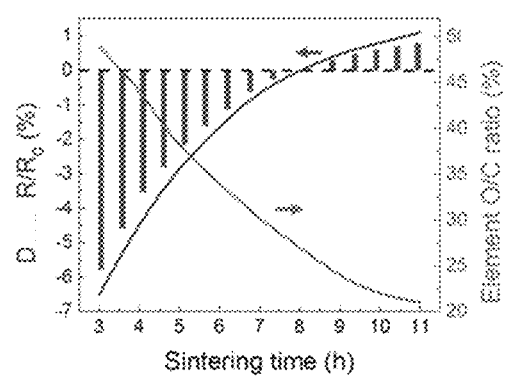
Figure 8C:
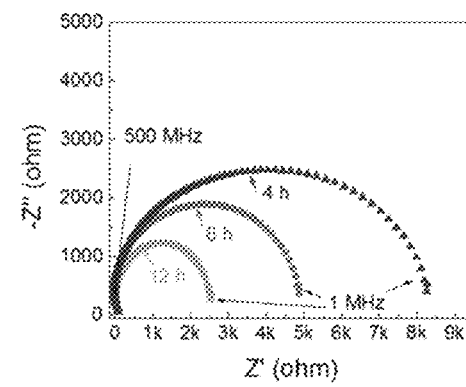

Third, the role of $R_{Intrinsic}$ was characterized through Nyquist plots, as shown in FIG. 8C. Results exhibited that with the increasing sintering time, both real part Z' and imaginary part Z" changed a lot, indicating a strong influence of $R_{Intrinsic}$. Moreover, the large value of the imaginary part Z" reveals the existence of $C_{EDL}$ in the junctions. A similar phenomenon can be deduced from the relationship between capacitance and frequency (FIG. 2C).

It can be concluded that with the MWCNT based conductive film, $R_{Junction}$ plays a crucial role on its resistance/humidity response whereas with r-GO based conductive film, $R_{Intrinsic}$ plays the leading role. However this phenomenon will reverse to $R_{Junction}$ when the sintering time reaches a certain value. Overall, the experimental results present a good concordance with our simple model.

Applications to Humidity Non-Sensitive Materials

Two kinds of carbon-based conductive films with humidity non-sensitive property were developed. One is based on the opposite resistance to humidity behavior of CNT and r-GO through adjusting the mass ratio between them. The other film is based on the reversion of r-GO's humidity response through optimizing the thermal-reducing time. In any case, both these strategies will be directed by Eq. 1, to allow $|\Delta R_{Intrinsic}|>|\Delta R_{Junction}|$. Thus, the total resistance variation ($\Sigma \Delta R$) will be close to zero under all humidity environments. Moreover, as regards the humidity non-sensitive property, it should be relative, and defined so that the resistance/humidity variation (Delta $R/R_0$) stays below 0.3%.

1) CNT/r-GO based conductive films with humidity non-sensitive properties were fabricated by adjusting the mass ratio between CNT (M) and r-GO (N) to reach the resistance-variation balance point.

Figure 9A:
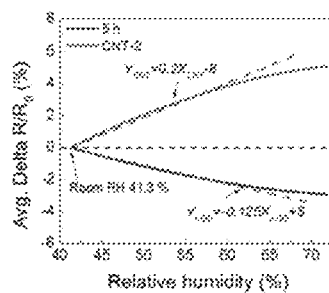
FIGS. 9A-9E demonstrate fabrication of humidity non-sensitive materials.
Figure 10:
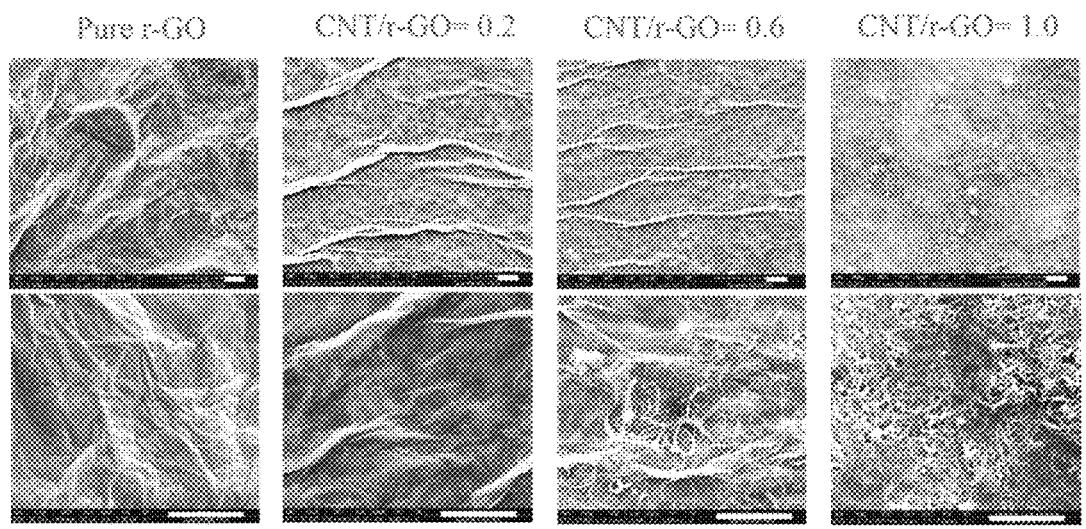
FIG. 10 depicts a series of SEM images of CNT-2/r-GO based conductive films with different mass ratios (from left to right, 0, 0.2, 0.6, and 1.0, respectively) sintered at 150° C. for 5 hours; all scale bar are 1 µm.

From FIG. 9A, MWCNT based conductive film (CNT-2) and r-GO based conductive film sintered at 150° C. for 5 h were chosen for demonstration, and their microstructures were presented in FIG. 10. Plots of response to humidity were generated and fitted accordingly to experimental results. Thus, when the mass ratio meets Eq. 2, the total resistance variation of CNT-2/r-GO based conductive film will be zero. According to calculation, the best mass ratio is about 0.625 (Eq. 3).

Figure 9B:
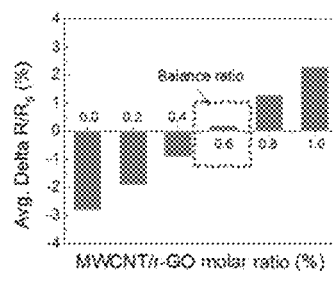

The feasibility of this strategy was further confirmed by experiments, as shown in FIG. 9B. It is shown that the balance point took place at around 0.6, which is highly consistent with the calculated value 0.625.

$$M \Box y_{CNT} + N \Box y_{r-GO} = 0 \quad (2)$$

$$\frac{M}{N} \approx 0.625 \quad (3)$$

Furthermore, the humidity non-sensitive property was highlighted via I-V curves.

Figure 9C:
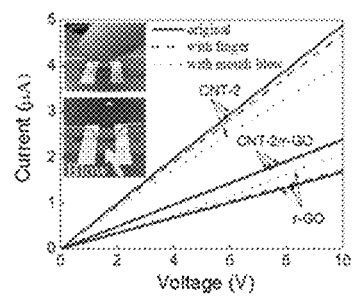

Results, summarized in FIG. 9C, show that for WMCNT/r-GO based conductive film (ratio=0.6), the I-V curves with or without finger for WMCNT/r-GO were precisely overlapping each other, demonstrating good humidity stability. The gradual deviation shown in reference curves (pure CNT-2 film and pure r-GO film) indicate their evident resistance/humidity responses. Moreover, from the different deviated direction of the I-V curves of pure-CNT-2 and pure-r-GO, the opposite resistance/humidity response was verified.

2) We have shown that r-GO's humidity response can be reversed from negative to positive when the sintering time is about 8 h at 150° C. Not wishing to be bound by any theory, it appears to be the balanced result between intrinsic resistance response to humidity (positive) and junction humidity response (negative), as shown in FIG. 8B.

Figure 9D:
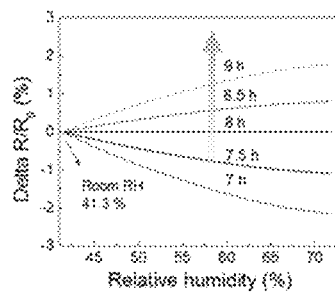

Therefore, we adjusted the sintering time of r-GO film to reach this balance ($|\Delta R_{Intrinsic}|=|\Delta R_{Junction}|$), as summarized in FIG. 9D. It is shown that when the sintering time is about 8 h at 150° C., the fabricated r-GO film resistance variation is close to zero.

Figure 9E:
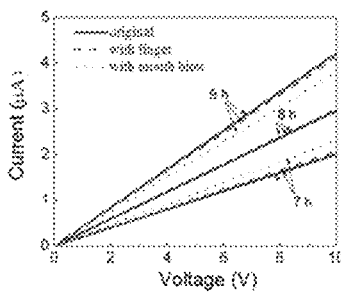

Likewise, the optimized sintering time was verified via I-V curves in FIG. 9E. The overlapping curves with/without finger for the r-GO based conductive film can be found with the sintering time of 8 h, compared with the staggered curves for that of 7 h and 9 h.

Hence, it results that r-GO based humidity non-sensitive film was obtained by optimizing the sintering time.

It should be emphasized that the above-described embodiments of the present disclosure are merely possible examples of implementations, and are set forth only for a clear understanding of the principles of the disclosure. Many variations and modifications may be made to the above-described embodiments of the disclosure without departing substantially from the spirit and principles of the disclosure. All such modifications and variations are intended to be included herein within the scope of this disclosure.

We claim:

1. A carbon-based semiconductor material comprising: reduced graphene oxide (r-GO),
wherein the r-GO is reduced such that the carbon-based semiconductor material has a resistance/humidity variation of −15% to 15%, and
wherein the carbon-based semiconductor material has an intrinsic resistance and a junction resistance, and is configured so that a total resistance variance, which includes the intrinsic resistance and the junction resistance, is −15% to 15% for an ambient humidity, the junction resistance being a contact resistance between carbon-based fibers or between r-GO plates of the carbon-based semiconductor material.

2. The carbon-based semiconductor material of claim 1, wherein the r-GO has been sintered at a temperature of 140° C. to 160° C. for a period of time of 7 hours to 9 hours so that a humidity response is reversed from a negative to a positive value.

3. The carbon-based semiconductor material of claim 1, further comprising carbon nanotubes (CNT), wherein the ratio of CNT to r-GO is configured such that the carbon-based semiconductor material has a resistance/humidity variation of −0.5% to 0.5%.

4. The carbon-based semiconductor material of claim 3, wherein a mass/mass ratio of CNT to r-GO is 0.3 to 0.7.

5. The carbon-based semiconductor material of claim 4, wherein a mass/mass ratio of CNT to r-GO is 0.625.

6. A device comprising:
a carbon-based semiconductor material, wherein the carbon-based semiconductor material comprises reduced graphene oxide (r-GO),
wherein the r-GO is reduced such that the carbon-based semiconductor material has a resistance/humidity variation of −15% to 15%, and
wherein the carbon-based semiconductor material has an intrinsic resistance and a junction resistance, and is configured so that a total resistance variance, which includes the intrinsic resistance and the junction resistance, is −15% to 15% for an ambient humidity, the junction resistance being a contact resistance between carbon-based fibers or between r-GO plates of the carbon-based semiconductor material.

7. The device of claim 6, further comprising a transparent substrate, which comprises polyethylene terephthalate, polycarbonate, polymethyl methacrylate, polyethylene naphthalate, polyethersulfone, polyvinyl alcohol, polyimide, polystyrene, or glass.

8. The device of claim 6, wherein the carbon-based semiconductor material further comprises:
carbon nanotubes (CNT), wherein a ratio of CNT to r-GO is configured such that the carbon-based semiconductor material has a resistance/humidity variation of −0.5% to 0.5%.

9. The device of claim 8, wherein a mass/mass ratio of CNT to r-GO is 0.3 to 0.7.

10. The device of claim 9, wherein a mass/mass ratio of CNT to r-GO is 0.625.

11. A method of making a carbon-based semiconductor material, the method comprising the steps of:
applying an ink to a surface of a substrate, wherein the ink comprises graphene oxide in a solvent,
drying the ink to produce a graphene oxide material or layer on the substrate, and
sintering the graphene oxide material or layer at a temperature and for a period of time wherein the carbon-based semiconductor material has a resistance/humidity variation of −5% to 5%,
wherein the carbon-based semiconductor material has an intrinsic resistance and a junction resistance, and is configured so that a total resistance variance, which includes the intrinsic resistance and the junction resistance, is −5% to 5% for an ambient humidity, the junction resistance being a contact resistance between carbon-based fibers or between r-GO plates of the carbon-based semiconductor material.

12. The method of claim 11, wherein the sintering is sufficient to produce a reduced graphene oxide (r-GO).

13. The method of claim 12, wherein the temperature is 130° C. to 150° C. and the period of time is 7 hours to 9 hours.

14. The method of making a material according to claim 11, wherein in the step of applying an ink to a surface of a substrate, the ink comprises carbon nanotubes (CNTs) and graphene oxide in a solvent, and
wherein the temperature, time, and ratio of CNT to r-GO in the ink are adjusted such that the carbon-based semiconductor material has a resistance/humidity variation of −5% to 5%.

15. The method of claim 14, wherein a mass/mass ratio of CNT to r-GO is 0.3 to 0.7.

16. The method of claim 15, wherein the mass/mass ratio of CNT to r-GO is 0.625.

17. The method of claim 11, wherein the temperature is 130° C. to 150° C. and the period of time is 3 hours to 7 hours.

18. The method of claim 11, wherein the temperature is 150° C. and the period of time is 8 hours.

19. The method of claim 11, wherein the substrate is a transparent substrate, which comprises polyethylene terephthalate, polycarbonate, polymethyl methacrylate, polyethylene naphthalate, polyethersulfone, polyvinyl alcohol, polyimide, polystyrene, or glass.

20. The method of claim 11, wherein the graphene oxide material or layer is in the solvent at a concentration of 0.05 mg/ml to 0.25 mg/ml.

* * * * *